(12) United States Patent
Jang et al.

(10) Patent No.: US 8,592,105 B2
(45) Date of Patent: Nov. 26, 2013

(54) PHOTOMASKS AND METHODS OF FABRICATING THE SAME

(75) Inventors: Il-Yong Jang, Yongin-si (KR);
Byung-Gook Kim, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 147 days.

(21) Appl. No.: 13/231,313

(22) Filed: Sep. 13, 2011

(65) Prior Publication Data
US 2012/0100465 A1    Apr. 26, 2012

(30) Foreign Application Priority Data
Oct. 20, 2010    (KR) .......................... 10-2010-0102587

(51) Int. Cl.
*G03F 1/00*    (2012.01)
(52) U.S. Cl.
USPC ............................................................ 430/5

(58) Field of Classification Search
USPC ...................................... 430/5, 322, 323, 324
See application file for complete search history.

(56) References Cited

U.S. PATENT DOCUMENTS

2010/0248093 A1*   9/2010   Yang ................................. 430/5

FOREIGN PATENT DOCUMENTS

| JP | 2003-107675 A | 4/2003 |
| KR | 10-2009-0021483 A | 3/2009 |
| KR | 10-2010-0033255 A | 3/2010 |

* cited by examiner

*Primary Examiner* — Stephen Rosasco
(74) *Attorney, Agent, or Firm* — Lee & Morse, P.C.

(57) ABSTRACT

A photomask includes a pattern area and a blind area, a first opaque pattern disposed on the blind area and having a first thickness, and a second opaque pattern disposed on the pattern area and having a second thickness smaller than the first thickness. The first and second opaque patterns are formed of the same material.

20 Claims, 8 Drawing Sheets

PHOTOMASKS AND METHODS OF FABRICATING THE SAME

CROSS-REFERENCE TO RELATED APPLICATION

This application claims priority under 35 U.S.C. §119 to Korean Patent Application No. 10-2010-0102587 filed on Oct. 20, 2010, the disclosure of which is hereby incorporated by reference in its entirety.

BACKGROUND

1. Field

Embodiments relate to a photomask used for fabricating a semiconductor device and a method of fabricating the same.

2. Description of the Related Art

In general, various patterns of a semiconductor device have been formed on a wafer using a photolithography technique. An increase in the integration density of semiconductor devices leads to the downscaling of contact patterns or interconnection patterns.

SUMMARY

In accordance with an aspect, there is provided a photomask including a photomask substrate including a pattern area and a blind area, a first opaque pattern disposed on the blind area and having a first thickness, and a second opaque pattern disposed on the pattern area and having a second thickness smaller than the first thickness, wherein the first and second opaque patterns are formed of a same material.

The first thickness may be about 1.5 to 2.5 times greater than the second thickness.

The first thickness may be about twice the second thickness.

The first and second opaque patterns may include an opaque material having a substantial transmittance of less than 0.1% under conditions of a light wavelength of about 193 nm.

The first and second opaque patterns may include MoSiON.

The first opaque pattern may have an optical density of at least 2.5.

The second opaque pattern may include a line-shaped main pattern and a sub-resolution-assist-feature (SRAF) pattern disposed on at least one side of the main pattern, the SRAF pattern having a normalized image log slope (NILS) of at least 2.8.

The second opaque pattern may include a transparent area, an opaque area, and a semitransparent area. The transparent area may be formed to a minimum thickness and may be substantially transparent. The opaque area may be formed to a maximum thickness and may be substantially opaque. The semitransparent area may be formed to an intermediate thickness between the minimum and maximum thicknesses.

According to an aspect, there is provided a photomask including a first opaque pattern disposed in a first region of a transparent substrate, and a second opaque pattern disposed in a second region of the transparent substrate and having a smaller thickness than the first opaque pattern.

The first opaque pattern may be formed of a single material

The first and second opaque patterns may include a MoSiON-based material through which a substantial amount of incident light cannot be transmitted.

The first opaque pattern may have a thickness of at least 930 Å, and the second opaque pattern has about ½ of the thickness of the first opaque pattern.

The second opaque pattern may have a thickness of about 720 Å or less. The first opaque pattern may have about twice the thickness of the second opaque pattern.

The second opaque pattern may have a thickness of at least 400 Å.

The first region may be a pattern area in a center of the transparent substrate, and the second region may be a blind area adjacent to the pattern area.

The first and second opaque patterns may be single layers, respectively.

According to an aspect, there is provided a photomask including a transparent substrate, a first opaque pattern disposed on the transparent substrate at a first region of the photomask, the first opaque pattern having a first thickness, the first thickness being selected such that the first opaque pattern has an optical density of at least 2.5, and a second opaque pattern disposed on the transparent substrate at a second region of the photomask, the second opaque pattern including an opaque area having a second thickness, the second thickness being less than the first thickness. The first and second opaque patterns may be formed of a same material. The first and second opaque patterns may be single layers, respectively.

The first and second opaque patterns may include MoSiON.

The second thickness being selected such that the opaque area of the second opaque pattern may have an optical density of at least 1.0.

The first region may be a pattern area at a center of the transparent substrate, and the second region may be a blind area adjacent to the pattern area.

The second opaque pattern may further include a semitransparent area having a thickness that is less than the maximum second thickness, and a transparent area having a third thickness that may be thinner than that of the second thickness. The photomask may further comprise a transparent area at a second region of the photomask. The transparent area may be portions of the transparent substrate being exposed by the second opaque pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
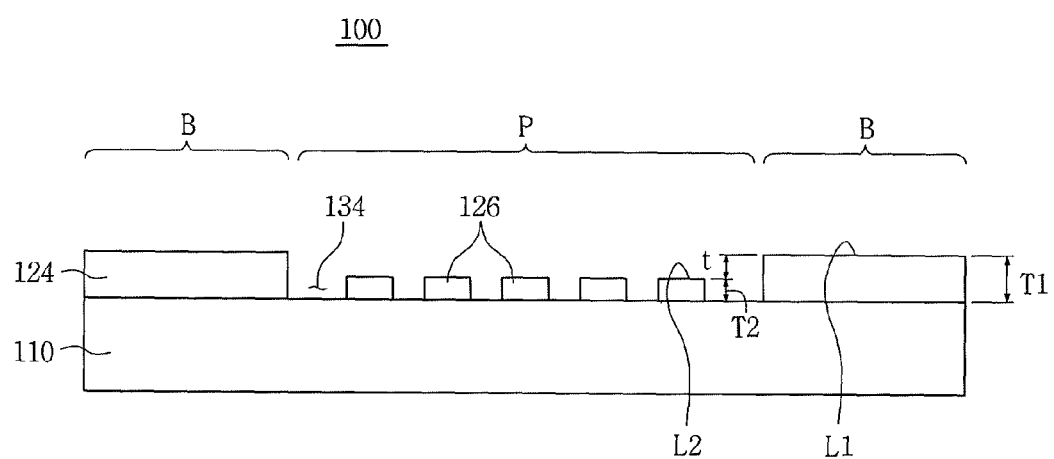
FIG. 1 illustrates a cross-sectional view of a photomask according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Embodiments are described herein with reference to plan and cross-section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are conceptual in nature and their shapes are not intended to illustrate the precise shape of a region of a device and are not intended to limit the scope thereof.

Hereinafter, photomasks and methods of fabricating the same according to embodiments will be described in detail with reference to the appended drawings.

Figure 2:
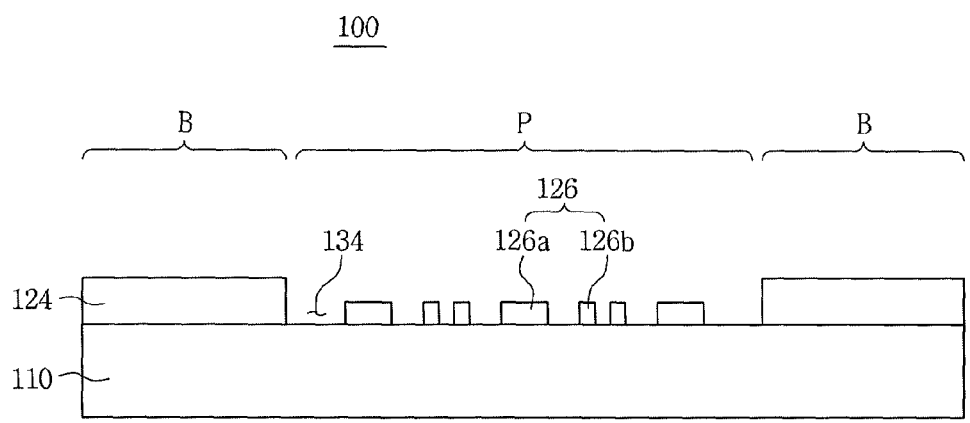
FIG. 2 illustrates a cross-sectional view of a photomask further including a sub-resolution assist feature (SRAF) pattern according to embodiments.
Figure 3:
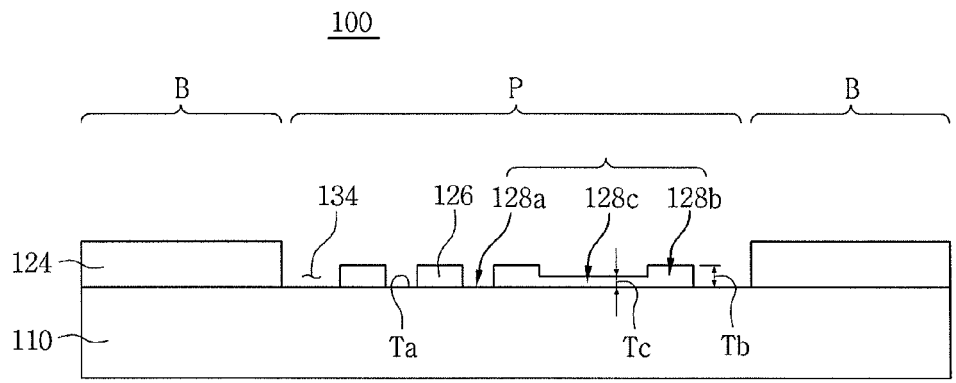
FIG. 3 illustrates a cross-sectional view of a gray-tone photomask according to embodiments.
Figure 4:
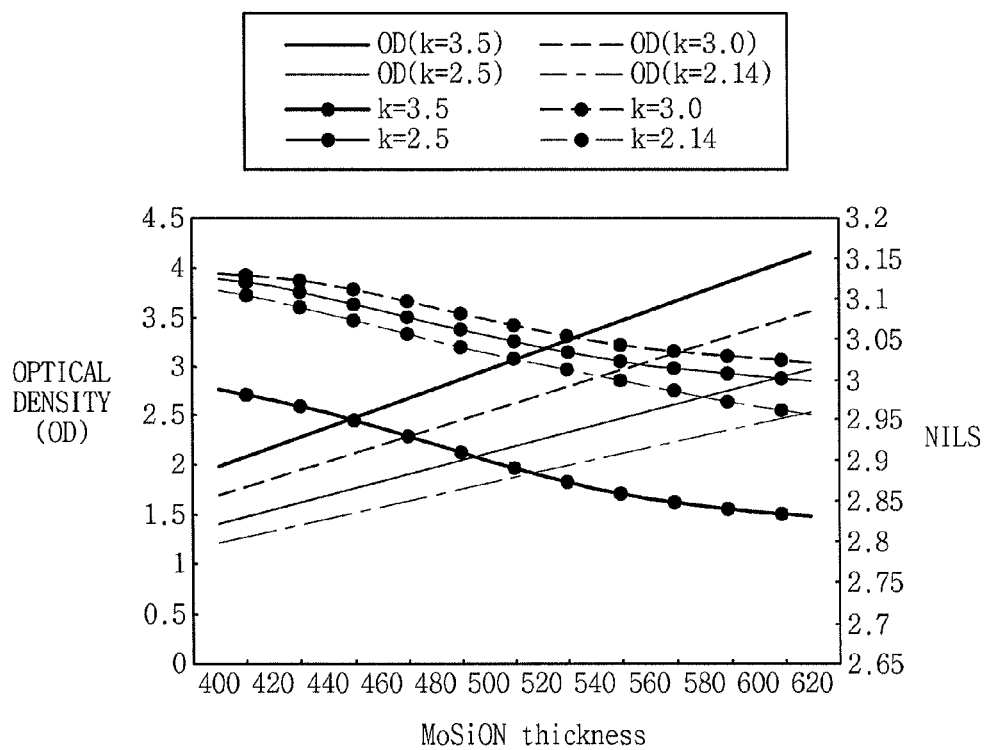
FIG. 4 illustrates a graph showing the relationship between the thickness and optical density OD of a second opaque pattern formed of MoSiON and the relationship between the thickness and normalized image log slope (NILS) of the second opaque pattern formed of MoSiON in a pattern area B of a photomask according to embodiments.

FIG. 1 is a cross-sectional view illustrating the configuration of a photomask according to embodiments, FIG. 2 is a cross-sectional view of a photomask further including a sub-resolution assist feature (SRAF) pattern according to embodiments, FIG. 3 is a cross-sectional view of a gray-tone photomask according to embodiments, and FIG. 4 is a graph showing the relationship between the thickness and optical density OD of a second opaque pattern formed of MoSiON and the relationship between the thickness and normalized image log slope (NILS) of the second opaque pattern formed of MoSiON in a pattern area B of a photomask according to embodiments.

Referring to FIG. 1, a photomask 100 may include a pattern area P in the center thereof and a blind area B adjacent to the pattern area P. The pattern area P may include a circuit pattern (e.g., a contact pattern or interconnection pattern) to be transferred to a wafer. The blind area B may include an alignment key (not shown) configured to align the photomask 100 with an exposure apparatus.

The photomask 100 may include a photomask substrate 110 configured to transmit incident light, and opaque patterns 124 and 126 disposed on the photomask substrate 110 and configured to block the incident light. The photomask substrate 110 may include quartz or silica-based glass. The opaque patterns 124 and 126 may include a first opaque pattern 124 disposed in the blind area B and a second opaque pattern 126 disposed in the pattern area P. In the pattern area P and the blind area B, a top surface of the photomask substrate 110 may have the same level.

The first and second opaque patterns 124 and 126 may be formed of a substantially opaque material so that incident light cannot form a photoresist pattern. The first and second opaque patterns 124 and 126 may be formed of an opaque material such as chromium (Cr), tantalum (Ta), molybdenum silicide (MoSi), molybdenum silicon nitride (MoSiN), molybdenum silicon carbon nitride (MoSiCN), molybdenum silicon oxynitride (MoSiON), or molybdenum silicon carbon oxynitride (MoSiCON). The first and second opaque patterns 124 and 126 may include a metal, a metal containing Si, or a metal containing Si, O, and N. In some embodiments, the first and second opaque patterns 124 and 126 may be formed of the same materials. In some embodiments, the first and second opaque patterns 124 and 126 may be formed of a single material. In some embodiments, the first and second opaque patterns 124 and 126 may be formed of a single layer, respectively. Herein, first and second opaque patterns 124 and 126 including MoSiON are described as a specific, non-limiting example. The term "opaque material" may refer to material that is opaque with respect to incident light having a light wavelength λ of 193 nm. For example, by appropriately controlling a composition ratio of Si, O, and N of opaque MoSiON, a light transmittance of less than 1% with respect to incident light may be realized. That is, the term "opaque material" may refer to a material that is substantially opaque. Conversely, when the light transmittance is at least 1%, MoSiON may be used as an attenuated material, and the phase of incident light may be shifted, causing a phase shift effect to occur between the second opaque pattern 126 and a pattern opening 134 defined by the second opaque pattern 126. In this case, the photomask 100 may be used as an attenuated phase-shift mask (PSM). However, when the light transmittance is less than 1%, the phase shift effect may not occur between the second opaque pattern 126 and the pattern opening 134, and only a transparent area configured to transmit incident light and an opaque area configured not to transmit the incident light may be provided, so that the photomask 100 may be used as a binary mask.

The first and second opaque patterns 124 and 126 may have different top-surface levels based on the surface of the photomask substrate 110. The first opaque pattern 124 may have a first top-surface level L1 from the surface of the photomask substrate 110, while the second opaque pattern 126 may have a second top-surface level L2 different from the first top-surface level L1. The first top-surface level L1 may be about 1.5 to 2.5 times higher than the second top-surface level L2. Thus, the first and second opaque patterns 124 and 126 may have first and second thicknesses T1 and T2 in the blind area B and the pattern area P, respectively. Herein, the term "thickness" may refer to a distance between the surface of the photomask substrate and a top surface of the first or second opaque pattern. In other words, thickness may be measured in a direction perpendicular to the substrate. The first and second thicknesses T1 and T2 may be different from each other. All the first opaque patterns 124 may be formed to the same thickness and all the second opaque patterns 126 may be formed to the same thickness.

In particular, the first top-surface level L1 may be twice as high as the second top-surface level L2, and the second opaque pattern 126 may have ½ the thickness of the first opaque pattern 124. The first top-surface level L1 or first thickness T1 of the first opaque pattern 124 may be appropriately determined in prior consideration of an optical density OD of the blind area B, and the second top-surface level L2 or second thickness T2 of the second opaque pattern 126 may be determined to be ½ the first top-surface level L1 or first thickness T1 of the first opaque pattern 124. For instance, when the first opaque pattern 124 has a thickness T1 of about 1320 Å to ensure a high optical density OD, the second opaque pattern 126 may have a thickness T2 of about 660 Å.

Conversely, the second top-surface level L2 or second thickness T2 of the second opaque pattern 124 may be appropriately determined in prior consideration of the resolution of the pattern area P, and the first top-surface level L1 or first thickness T1 of the first opaque pattern 124 may be determined to be twice the second top-surface level L2 or second thickness T2 of the second opaque pattern 126. For example, when the second opaque pattern 126 has a thickness T2 of about 660 Å to obtain a good resolution, the first opaque pattern 124 may have a thickness T1 of about 1320 Å.

The light transmittance of the blind area B may be substantially controlled to be zero (0) so that incident light cannot be transmitted through the vicinity of the photomask 100 during an exposure process, thereby precluding the formation of unnecessary patterns on the wafer. Accordingly, the optical density OD of the blind area B may be at least 2.5, or, for example, stably at 3.0, so that unnecessary light cannot be transmitted through the wafer. Moreover, the first thickness T1 of the first opaque pattern 124 may be increased to account for the loss of thin layers that unavoidably occurs in the blind area B due to repeated use or periodic cleaning. Such loss may gradually reduce the thickness of the first opaque pattern 124 and if such loss is not taken into account in determining the first thickness T1 of the first opaque pattern 124, ensuring a high optical density OD may be difficult. For example, when exposure light has a wavelength λ of 193 nm, the first opaque pattern 124 formed in the blind area B may have a thickness of at least 1090 Å to ensure an optical density OD of at least 2.5.

Furthermore, the pattern area P may include contact patterns or interconnection patterns to be transferred to a wafer. The contact patterns or interconnection patterns may be downscaled with an increase in the integration density of semiconductor devices. Accordingly, an interval between the second opaque patterns 126 may be reduced. The pattern openings 134 defined by the second opaque patterns 126 may also be reduced with a reduction in interval between the second opaque patterns 126. A 3-dimensional (3D) effect caused by the thickness T2 of the second opaque patterns 126 may occur, and the resolution of the second opaque patterns 126 may be degraded. Accordingly, to improve the resolution of the second opaque patterns 126, the thickness T2 of the second opaque pattern 126 disposed in the pattern area P may be reduced as the pattern openings 134 decrease. For example, the second opaque patterns 126 may have a thickness of 720 Å or less. The term "3-D effect" may refer to degradation of resolution due to light reflected by a sidewall of the second opaque pattern 126 with an increase in the thickness of the second opaque pattern 126.

Referring to FIG. 2, the second opaque pattern 126 may include a main pattern 126a and a sub-resolution assist feature (SRAF) pattern 126b. To increase the resolution of the main pattern 126a, the second opaque pattern 126 may further include the SRAF pattern 126b. For example, the main pattern 126a may be a line pattern with a relatively low pattern density, and the SRAF patterns 126b may be further formed on at least one side of the main pattern 126a. When the main pattern 126a is a contact pattern, the SRAF pattern 126b may be further formed on at least one of four sides of the main pattern 126a. The SRAF pattern 126b may be a subsidiary pattern with a smaller width than the wavelength of incident light and may function to compensate for an optical proximity effect (OPE). More specifically, the width of the SRAF pattern 126b may be ½ or less than the wavelength of incident light. Presently, the development of a photolithography technique has led to the formation of patterns with a width smaller than the wavelength of incident light. Accordingly, the SRAF pattern 126b may have such a small width as to preclude the formation of patterns using a photolithography technique.

Thus, the formation of the SRAF pattern 126b may be desirable to eliminate an OPE. As described above, with an increase in the integration density of semiconductor devices and a reduction in design rule, the main pattern 126a and the SRAF pattern 126b are being proportionally downscaled and thinned out. Due to the demand for thinner layers, the thickness of the second opaque pattern 126 is becoming thinner and thinner (i.e., 720 Å→590 Å→480 Å). Accordingly, the second opaque pattern 126 may have a thickness T2 of about 720 Å or less.

The second opaque pattern 126 functions to block incident light. Accordingly, there may be a specific limit to reducing the thickness T2 of the second opaque pattern 126. For example, the second opaque pattern 126 may be formed to a thickness of at least 400 Å. The second opaque pattern 126 may have a light transmittance of at least 0.1%. However, when the second opaque pattern 126 has a thickness of less than 400 Å, the light transmittance of at least 0.1% cannot be ensured.

Referring to FIG. 3, the second opaque pattern 126 may include a transparent area 128a, an opaque area 128b, and a semitransparent area 128c. The transparent area 128a may be formed to a minimum thickness Ta so that the transparent area 128a can substantially have a light transmittance of nearly 100 and be transparent. The opaque area 128b may be formed to a maximum thickness Tb, substantially have a light transmittance of 0, and be opaque. The maximum thickness Tb may correspond to the thickness T2 of the second opaque pattern. The semitransparent area 128c may be formed to an intermediate thickness between the minimum thickness Ta and the maximum thickness Tb so that the light transmittance of the semitransparent area 128c can be controlled to be in the range of about 1 to 99. In this case, the photomask 100 may be used as a gray-tone photomask.

FIG. 4 is a graph of optical density OD and the normalized image log slope (NILS), which may be ensured in the pattern area P, relative to the thickness T2 of the second opaque pattern 126 according to embodiments. Referring to FIG. 4, the NILS shows the image definition of the second opaque pattern 126. For instance, the NILS, which is a variable indicating the image definition of the second opaque pattern 126, may be a slope of an image definition curve. Accordingly, as the NILS increases, the image definition may also increase. For example, when the second opaque pattern 126 is formed of MoSiON and has a constant absorbance k under conditions where incident light has a wavelength λ of about 193 nm, as the thickness of the second opaque pattern 126 formed of MoSiON increases, the NILS and resolution of the second opaque pattern 126 may be reduced. Conversely, as the thickness of the second opaque pattern 126 formed of MoSiON decreases, the NILS of the second opaque pattern 126 may be proportionally increased. In particular, when the second opaque pattern 126 has a thickness T2 of about 620 Å or less, since the NILS sharply increases at a value of 2.8 or more, image definition may be improved.

However, the optical density OD may be reduced with a reduction in the thickness (Å) of the second opaque pattern 124 including MoSiON. The optical density OD may increase with an increase in light absorbance k under conditions where incident light has a wavelength λ of 193 nm. When the second opaque pattern 124 has a constant light absorbance k, the optical density OD of the second opaque pattern 124 may be increased in proportion to the thickness of the second opaque pattern 124 including MoSiON. Accordingly, to increase the NILS of the second opaque pattern 126, the thickness of the second opaque pattern 126 can be not infinitely reduced but may be appropriately determined to ensure the minimum optical density OD. For example, when the second opaque pattern 126 has a thickness of at least 400 Å, an optical density OD of at least 1 and a light transmittance of about 0.1% may be ensured, so that the photomask according to the embodiments can be used as a binary photomask.

Thus, when the first and second opaque patterns 124 and 126 are controlled at different top-surface levels L1 and L2, the second top-surface level L2 of the second opaque pattern 126 becomes lower than the first top-surface level L1 of the first opaque pattern 124 on the basis of the first opaque pattern 124. The first opaque pattern 124 may be formed to such an appropriate thickness as to ensure the optical density OD even without consideration of the second thickness T2 of the second opaque pattern 126. Conversely, since the first top-surface level L1 of the first opaque pattern 124 becomes higher than the second top-surface level L2 of the second opaque pattern 126 on the basis of the second opaque pattern 126, the second opaque pattern 126 may be made thin and formed to such an appropriate thickness as to improve resolution even without consideration of the first thickness T1 of the first opaque pattern 124.

Hereinafter, methods of fabricating photomasks according to embodiments will be described in detail with reference to the appended drawings.

Figure 5:
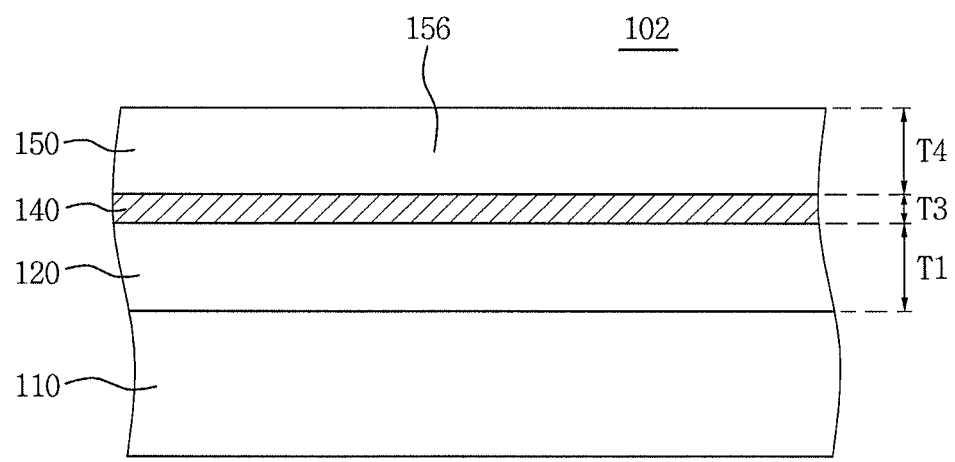
FIG. 5 illustrates a longitudinal cross-sectional view of a blank photomask.

FIG. 5 is a longitudinal cross-sectional view of a blank photomask, and FIGS. 6A through 6I are longitudinal cross-sectional views illustrating a method of fabricating a photomask.

Referring to FIG. 5, a blank photomask 102 may include a photomask substrate 110, an opaque layer 120 stacked on the photomask substrate 110, a hard mask layer 140 stacked on the opaque layer 120, and a first photoresist layer 150 stacked on the hard mask layer 140. Although not shown, the blank photomask 102 may further include an anti-reflective layer (ARL) disposed on the hard mask layer 140. The first photoresist layer 150 may be an electronic beam (e-beam) resist layer.

The photomask substrate 110 may be formed of quartz or glass, which is a crystalline, transparent material that may transmit incident light.

The opaque layer 120 may be formed of an opaque material, such as chromium (Cr), tantalum (Ta), or molybdenum silicon oxynitride (MoSiON), so that incident light cannot be transmitted through the photomask substrate 110. When the opaque layer 120 is formed of MoSiON, the opaque layer 120 may be formed to a thickness T1 between 930 Å and 1320 Å to ensure an optical density OD in the blind area B.

The hard mask layer 140 may be formed of Cr, chromium carbide (CrC), chromium nitride (CrN), chromium carbon nitride (CrCN), or a molybdenum silicide (MoSi)-based material. For example, when the opaque layer 120 is formed of Cr, the hard mask layer 140 may be formed of MoSi. When the opaque layer 120 is formed of MoSi, the hard mask layer 140 may be formed of Cr. To enable fine patterning of the opaque layer 120, the hard mask layer 140 may be as thin as possible. However, if the hard mask layer 140 is excessively thin, it may be difficult for the hard mask layer 140 to keep functioning as a mask required for patterning the opaque layer 120. Accordingly, for example, the hard mask layer 140 may be foamed to a smallest possible thickness of at least 50 Å. On an experimental basis, to maintain the opaque layer 120 having a thickness of at least 600 Å, when the hard mask layer 140 has a thickness of less than 50 Å, the hard mask layer 140 cannot function as an etch mask in consideration of etch selectivity with respect to the opaque layer 120. Conversely, when the thickness of the hard mask layer 140 increases, the thickness of the first photoresist layer 150 should also increase. As a result, forming fine patterns of the first photoresist layer 150 may be difficult. For example, when the hard mask layer 140 is formed of Cr, the hard mask layer 140 may be formed to a thickness T3 between 50 Å and 160 Å to make the first photoresist layer 150 thin.

The first photoresist layer 150 may be a positive or negative photosensitive layer. The first photoresist layer 150 may be formed to a minimum possible thickness in consideration of the thickness of the hard mask layer 140 and etch selectivity with respect to the hard mask layer 140. The first photoresist layer 150 may be formed to a thickness T4 between 100 Å and 800 Å to improve pattern resolution and facilitate pattern miniaturization.

Figure 6A:
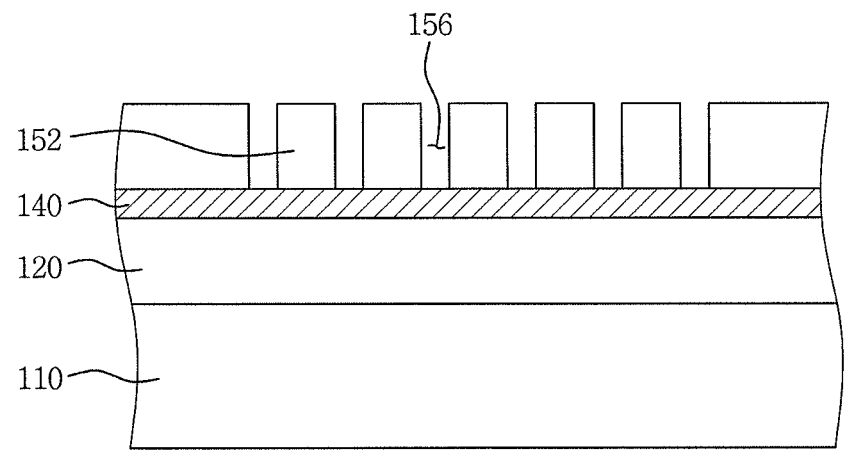
FIGS. 6A through 6I illustrate longitudinal cross-sectional views relating to a method of fabricating a photomask according to embodiments.

Referring to FIG. 6A, a first photolithography process or first e-beam lithography process using electronic beams may be performed on the first photoresist layer (refer to 150 in FIG. 5). For example, only a portion of the pattern area P may be selectively removed using first exposure and developing processes, thereby forming a first photoresist pattern 152 defining a first photoresist opening 156. The first photoresist pattern 152 may be formed to have a plurality of holes used for forming contacts, or the first photoresist pattern 152 may be formed to have a plurality of line-and-spaces used for forming interconnections.

Figure 6B:
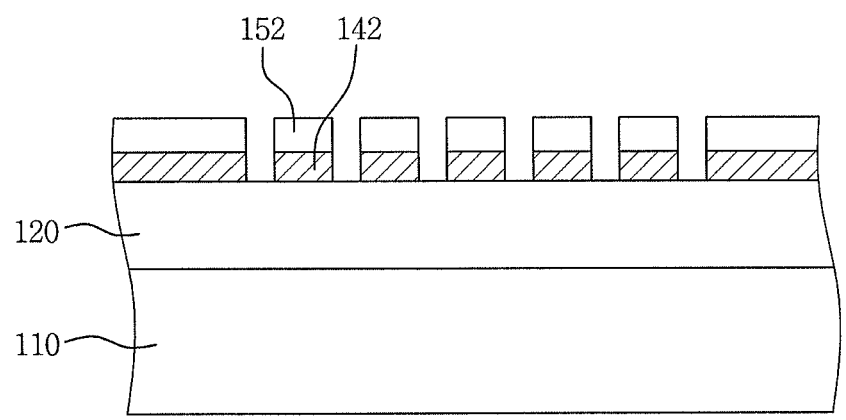

Referring to FIG. 6B, the hard mask layer 140 may be dry etched using the first photoresist pattern 152 as an etch mask. Thus, a hard mask pattern 142 may be formed to selectively expose the opaque layer 120. Various etch gases may be used according to the type of the hard mask layer 140. For example, when the hard mask layer 140 is formed of Cr, the hard mask pattern 142 may be formed by performing a plasma dry etching process using $Cl_2$ and $O_2$ as an etch gas. A mixture ratio of $Cl_2$ gas to $O_2$ gas may be appropriately controlled according to etch selectivity of the first photoresist pattern 152 with respect to the hard mask layer 140.

Figure 6C:
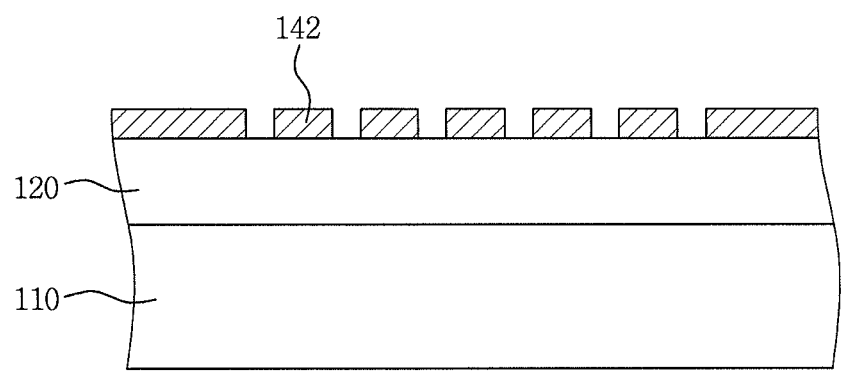

Referring to FIG. 6C, the first photoresist pattern 152 may be stripped. The first photoresist pattern 152 may be stripped by a wet strip process using sulfuric acid or a plasma strip process using oxygen ($O_2$).

Figure 6D:
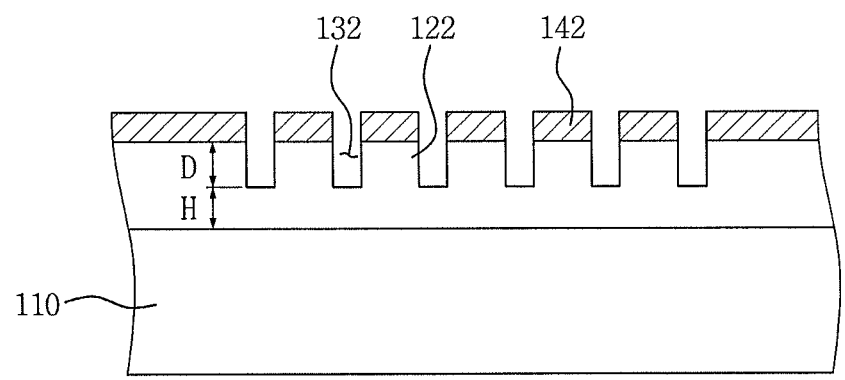

Referring to FIG. 6D, the opaque layer 120 may be half-etched using the hard mask pattern 142 as an etch mask. Thus, a half opaque pattern 122 defining a half opening 132 may be formed. Various etch gases may be used according to the type of the opaque layer 120. For example, when the opaque layer 120 is formed of MoSiON, the formation of the half opaque pattern 122 may be performed by a plasma dry etching process using an etch gas including $CF_4$, $CF_4/O_2$, $CHF_3$, $CHF_3/O_2$, $SF_6$, or $SF_6/O_2$.

Here, the term "half-etched extent" may refer to an extent to which the opaque layer 120 as an etch target object is not completely etched. For example, the half-etched extent may be an extent that allows an unetched height H of the half opening 132 to correspond to a difference (refer to t in FIG. 6I) between the thickness (refer to T1 in FIG. 6I) of the first opaque pattern 124 disposed in the blind area B and the thickness (refer to T2 in FIG. 6I) of the second opaque pattern 126 disposed in the pattern area P. Like the first photoresist pattern 152, the half opaque pattern 122 may be formed as a predetermined contact pattern or interconnection pattern. In this case, the half opening 132 may not expose the photomask substrate 110, and the half opaque pattern 122 may be formed to be thicker by a thickness T from the photomask substrate 110 within the half opening 132.

By appropriately adjusting the etch stop point, a half-etched extent to which a portion of the opaque layer 120 is recessed may be determined. The etch stop point may be a point in time when a depth D of the half opening 132 recessed by an etching process is equalized to the thickness T2 of the second opaque pattern 126 of the pattern area P formed during a subsequent process and also, a point in time when the height H of the remaining portion of the recessed opaque layer 120 is equalized to a difference t between the thickness T1 of the opaque layer 120 and the thickness T2 of the second opaque pattern 126 formed during the subsequent process (H=T1−T2=t).

According to embodiments, when the half-etched extent is determined to be ½ the thickness T1 of the opaque layer 120, the depth D of the half opening 132 may be equalized to the remaining height H, and the thickness T2 of the second opaque pattern 126 may be ½ the thickness T1 of the opaque layer 120. As a result, a condition under which the thickness T1 of the first opaque pattern 124 disposed in the blind area B becomes twice the thickness T2 of the second opaque pattern 126 may be prepared, the blind area B may ensure an optical density of at least 3.0, and the pattern area P may have a higher resolution. For brevity, the half-etched extent is ½ in the drawings.

Figure 6E:
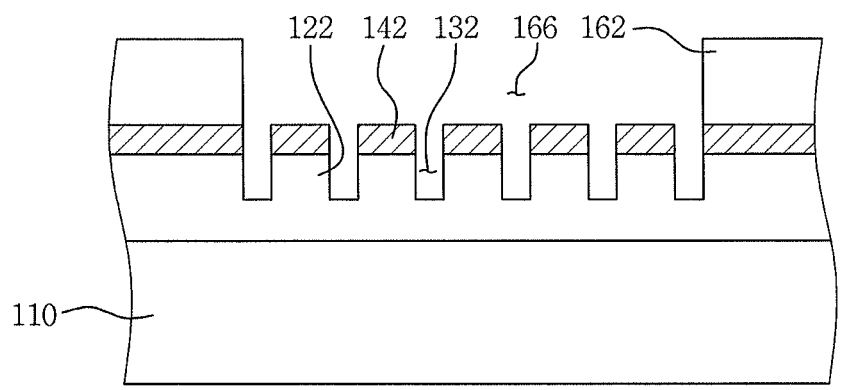

Referring to FIG. 6E, a second photoresist layer (not shown) may be stacked, and a second photolithography process may be performed to open the pattern area P. For example, second exposure and developing processes may be performed on the second photoresist layer, thereby forming a second photoresist pattern 162 defining a second photoresist opening 166.

Figure 6F:
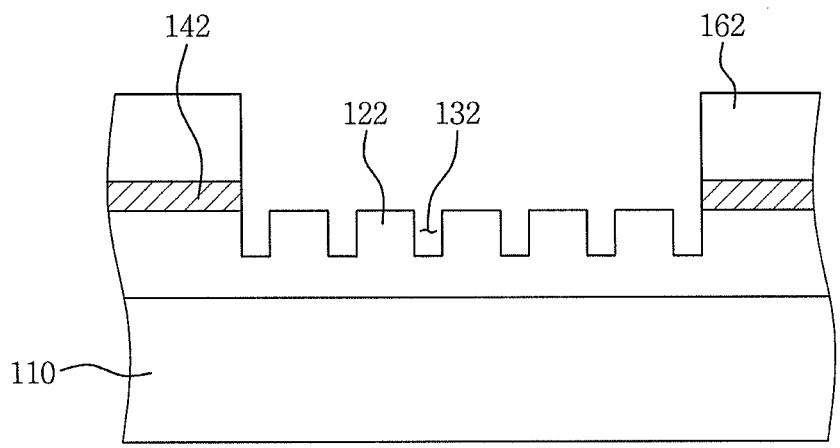

Referring to FIG. 6F, an etching process may be performed using the second photoresist pattern 162 as an etch mask. Thus, the hard mask pattern (refer to 142 in FIG. 6E) disposed in the pattern area P may be removed.

Figure 6G:
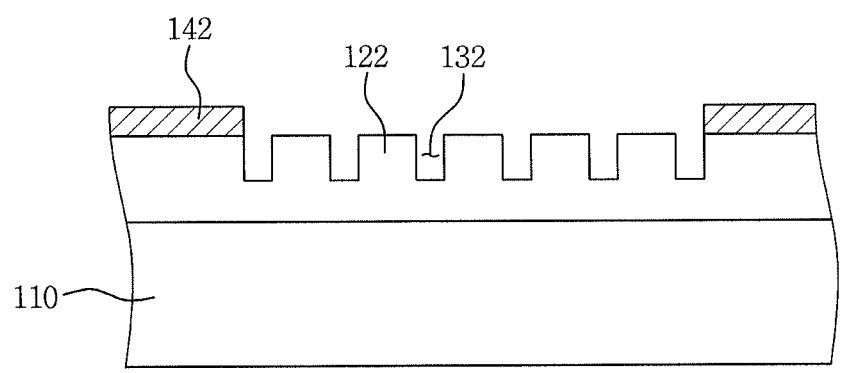

Referring to FIG. 6G, the second photoresist pattern (refer to 162 in FIG. 6F) may be removed. The hard mask pattern 142 disposed in the blind area B may remain.

Figure 6H:
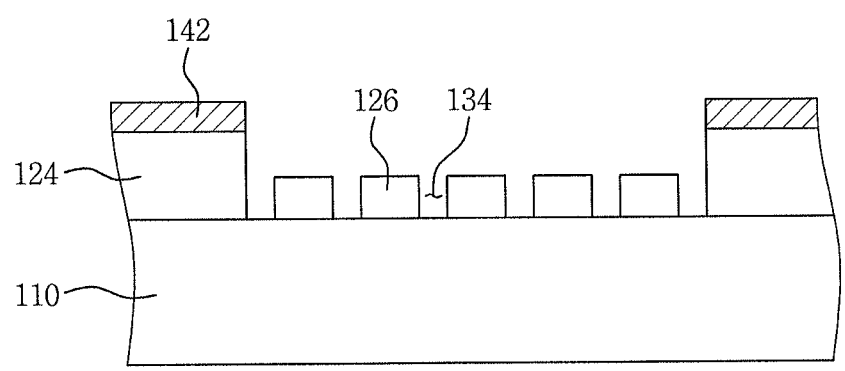

Referring to FIG. 6H, an etching process may be performed using the hard mask pattern 142 disposed in the blind area B as an etch mask, thereby reducing the entire height of the half opaque pattern 122 in the pattern area P. Thus, the second opaque pattern 126 may be formed in the pattern area P. That is, by removing the entire pattern area P by as much as a thickness t, the thickness of the half opaque pattern 122 may be reduced to the thickness T2 of the second opaque pattern 126, and the half opaque pattern 122 left within the half opening 132 may be completely removed, so that the half opening 132 can turn into the pattern opening 134 and the photomask substrate 110 can be exposed. By appropriately adjusting an etch stop point, a recessed amount of the half opaque pattern 122 left within the half opening (refer to 132 in FIG. 6G) may be determined. For example, an etch stop point may be a point in time when the photomask substrate 110 is exposed by completely removing the half opaque pattern (refer to 122 in FIG. 6G) under the half opening (refer to 132 in FIG. 6G) formed during an etching process.

Figure 6I:
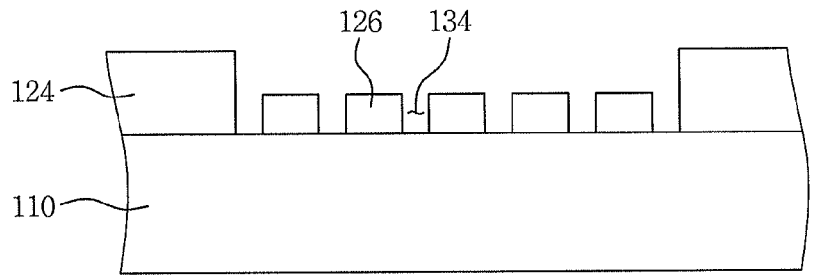

Referring to FIG. 6I, the hard mask pattern 142 disposed in the blind area B may be removed. In the present embodiment, the hard mask pattern 142 disposed in the blind area B may function as a sacrificial pattern used as an etch mask during an etching process and then removed, and a sufficient optical density OD may be ensured in the blind area B due to the first opaque pattern 124. Accordingly, the hard mask layer 140 required for forming the hard mask pattern 142 may be formed to a minimum thickness without consideration of the optical density OD. Furthermore, when the hard mask layer 140 is formed to the minimum thickness, the thickness of the first photoresist pattern 150 required for patterning the hard mask layer 140 to form the hard mask pattern 142 may also be minimized. In particular, when an SRAF pattern (or subsidiary pattern) is formed, since the thickness of the first photoresist layer 150 may be reduced, an aspect ratio of patterns may be reduced, and the collapse of patterns may be prevented.

Also, the hard mask pattern 142 may be allowed to remain to ensure the optical density OD of the blind area B. Although the optical density OD of the blind area B may be at least 2.5 by the presence of the first opaque pattern 124, when the hard mask pattern 142 is not removed but used intact, a pattern thickness between 50 Å and 160 Å may be further added in the blind area B so that an optical density of at least 3.0 can be ensured.

Figure 7:
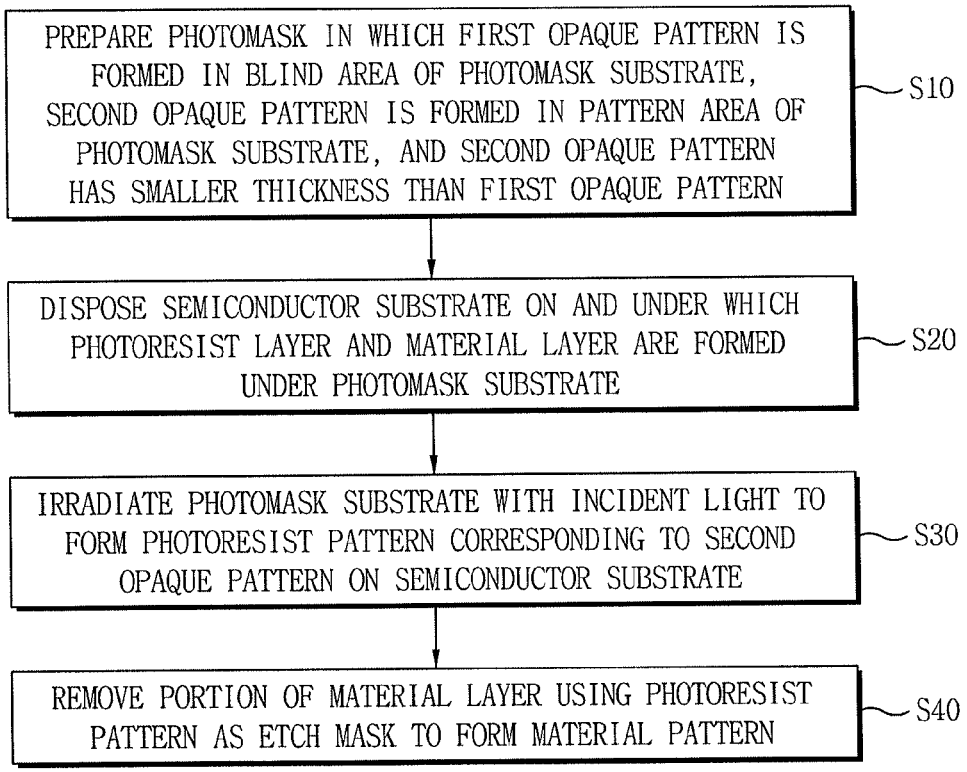
FIG. 7 illustrates a flowchart relating to a method of fabricating a semiconductor device using a photomask according to embodiments.

FIG. 7 is a flowchart illustrating a method of fabricating a semiconductor device using a photomask.

Referring to FIG. 7, a photomask 100 including a photomask substrate 110 having a blind area PA and a pattern area CA, a first opaque pattern 124 disposed on the blind area PA, and a second opaque pattern 126 disposed on the pattern area CA and having a smaller thickness than the first opaque pattern 124 may be prepared (operation S10). A semiconductor substrate on and under which a photoresist layer and a material layer are formed may be disposed under the photomask substrate 110 (operation S20). The photomask substrate 110 may be irradiated with incident light, thereby forming a photoresist pattern corresponding to the second opaque pattern 126 on the semiconductor substrate (operation S30). A portion of the material layer may be removed using the photoresist pattern as an etch mask, thereby forming a material pattern (operation S40). As a result, a semiconductor device may be fabricated using the photomask 100.

By way of summation and review, an increase in the integration density of semiconductor devices leads to the downscaling of contact patterns or interconnection patterns. Accordingly, it becomes difficult to use conventional photomasks.

The present embodiments advance the art by providing, high-resolution binary photomasks that may be used instead of the conventional photomasks. According to embodiments, the thickness of an opaque pattern formed in a blind area B can be maintained constant to keep an optical density intact, and the thickness of the opaque pattern formed in a pattern area P may be reduced or halved, thereby comparatively increasing the resolution of a photomask.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photomask comprising:
   a photomask substrate including a pattern area and a blind area;
   a first MoSiON pattern disposed on the blind area and having a first thickness; and a second MoSiON pattern disposed on the pattern area and having a second thickness smaller than the first thickness.

2. The photomask as claimed in claim 1, wherein the first thickness is about 1.5 to 2.5 times greater than the second thickness.

3. The photomask as claimed in claim 2, wherein the first thickness is about twice the second thickness.

4. The photomask as claimed in claim 1, wherein the first and second MoSiON patterns have a substantial transmittance of less than 0.1% under conditions of a light wavelength of about 193 nm.

5. The photomask as claimed in claim 1, wherein the first MoSiON pattern has an optical density of at least 2.5.

6. The photomask as claimed in claim 1, wherein the second MoSiON pattern includes a line-shaped main pattern and a sub-resolution-assist-feature (SRAF) pattern disposed on at least one side of the main pattern, the SRAF pattern having a normalized image log slope (NILS) of at least 2.8.

7. The photomask as claimed in claim 1, wherein the second MoSiON pattern includes an opening area, thick MoSiON area, and a thin MoSiON area.

8. A photomask comprising:
a first MoSiON pattern disposed in a first region of a transparent substrate; and
a second MoSiON pattern disposed in a second region of the transparent substrate and having a smaller thickness than the first MoSiON pattern.

9. The photomask as claimed in claim 8, wherein the first MoSiON pattern has a thickness of at least 930 Å, and the second MoSiON pattern has about ½ of the thickness of the first MoSiON pattern.

10. The photomask as claimed in claim 8, wherein the second MoSiON pattern has a thickness of about 720 Å or less, and the first MoSiON pattern has about twice the thickness of the second MoSiON pattern.

11. The photomask as claimed in claim 10, wherein the second MoSiON pattern has a thickness of at least 400 Å.

12. The photomask as claimed in claim 8, wherein the first region is a pattern area in a center of the transparent substrate, and the second region is a blind area adjacent to the pattern area.

13. The photomask as claimed in claim 8, wherein the first and second MoSiON patterns are single layers, respectively.

14. The photomask as claimed in claim 1, wherein the first and second MoSiON patterns are disposed directly on the blind area and pattern area, respectively.

15. A photomask comprising:
a transparent substrate;
a first MoSiON pattern disposed on the transparent substrate at a first region of the photomask, the first MoSiON pattern having a first thickness, the first thickness being selected such that the first MoSiON pattern has an optical density of at least 2.5; and
a second MoSiON pattern disposed on the transparent substrate at a second region of the photomask, the second MoSiON pattern including an opaque area having a second thickness, the second thickness being less than the first thickness, wherein the first and second MoSiON patterns are single layers, respectively.

16. The photomask as claimed in claim 15, wherein the second thickness is selected such that the opaque area of the second MoSiON pattern has an optical density of at least 1.0.

17. The photomask as claimed in claim 15, wherein the first region is a pattern area at a center of the transparent substrate, and the second region is a blind area adjacent to the pattern area.

18. The photomask as claimed in claim 15, wherein the second MoSiON pattern further includes: a semitransparent area having a third thickness that is thinner than the second thickness.

19. The photomask as claimed in claim 18, further comprising:
a transparent area at a second region of the photomask, wherein the transparent area being portions of the transparent substrate being exposed by the second MoSiON pattern.

20. The photomask as claimed in claim 8, wherein the first and second MOSiON patterns are disposed directly on the transparent substrate.

* * * * *